United States Patent
Yajima et al.

(10) Patent No.: US 11,869,908 B2
(45) Date of Patent: Jan. 9, 2024

(54) PHOTOSENSITIVE CHIP PACKAGE STRUCTURE, CAMERA MODULE, AND MOBILE TERMINAL

(71) Applicant: Honor Device Co., Ltd., Guangdong (CN)

(72) Inventors: Atsushi Yajima, Shenzhen (CN); Kun Ran, Dongguan (CN); Zhendong Luo, Shenzhen (CN); Lifeng Fu, Dongguan (CN); Weichih Lin, Dongguan (CN); Changfu Huang, Dongguan (CN)

(73) Assignee: Honor Device Co., Ltd., Shenzhen (CN)

( * ) Notice: Subject to any disclaimer, the term of this patent is extended or adjusted under 35 U.S.C. 154(b) by 546 days.

(21) Appl. No.: 17/266,057

(22) PCT Filed: Aug. 27, 2018

(86) PCT No.: PCT/CN2018/102540
§ 371 (c)(1),
(2) Date: Feb. 4, 2021

(87) PCT Pub. No.: WO2020/041942
PCT Pub. Date: Mar. 5, 2020

(65) Prior Publication Data
US 2021/0313366 A1    Oct. 7, 2021

(51) Int. Cl.
*H01L 27/146* (2006.01)

(52) U.S. Cl.
CPC .. *H01L 27/14618* (2013.01); *H01L 27/14625* (2013.01); *H01L 27/14636* (2013.01)

(58) Field of Classification Search
None
See application file for complete search history.

(56) References Cited

U.S. PATENT DOCUMENTS

| | | | |
|---|---|---|---|
| 2004/0113286 A1 | 6/2004 | Hsieh et al. | |
| 2011/0175182 A1 | 7/2011 | Chen et al. | |
| 2021/0313366 A1* | 10/2021 | Yajima | H04N 23/54 |

FOREIGN PATENT DOCUMENTS

| | | |
|---|---|---|
| CN | 101179086 A | 5/2008 |
| CN | 102117817 A | 7/2011 |
| CN | 205883378 U | 1/2017 |

(Continued)

*Primary Examiner* — Jack S Chen
(74) *Attorney, Agent, or Firm* — Leydig, Voit & Mayer, Ltd.

(57) ABSTRACT

A terminal includes a substrate and a photosensitive chip mounted on the substrate, where a side of the photosensitive chip away from the substrate has a photosensitive area and a non-photosensitive area surrounding the photosensitive area, and the photosensitive chip is electrically connected to the substrate by using a metal wire; and the photosensitive chip package structure further includes: a frame, disposed on the side of the photosensitive chip away from the substrate, where an avoidance groove used to avoid the metal wire is disposed on a side of the frame facing the substrate, the avoidance groove extends along a side edge of the frame, and an inner wall of the avoidance groove is an arc-shaped inner wall; and a filling glue, filled in the avoidance groove, and used to wrap the metal wire and bond the frame to the non-photosensitive area of the photosensitive chip and the substrate.

17 Claims, 6 Drawing Sheets

(56) References Cited

FOREIGN PATENT DOCUMENTS

| | | | |
|---|---|---|---|
| CN | 107301988 A | 10/2017 | |
| CN | 207706274 U | 8/2018 | |
| WO | WO 2011/055508 A1 | 5/2011 | |

\* cited by examiner

PHOTOSENSITIVE CHIP PACKAGE STRUCTURE, CAMERA MODULE, AND MOBILE TERMINAL

CROSS-REFERENCE TO RELATED APPLICATIONS

This application is a national stage of International Application No. PCT/CN2018/102540, filed on Aug. 27, 2018, which is hereby incorporated by reference in its entirety.

TECHNICAL FIELD

This application relates to the technical field of electronic devices, and in particular, to a photosensitive chip package structure, a camera module, and a mobile terminal.

BACKGROUND

With continuous advancement of mobile phone miniaturization and ultra-thin design, a mobile phone component is also facing a severe challenge of miniaturization development. As an important module component of a mobile phone, a camera module needs to be further reduced in size to meet a current development need. As shown in FIG. 1, a conventional camera module includes a circuit board 01, a photosensitive chip 02 disposed on the circuit board 01, a package cover 03, an optical filter 04, a voice coil motor 05, and a camera 06. A signal pin 011 and a surface-mount device 012 such as a capacitor and a resistor are disposed on an area of the circuit board 01 that avoids the photosensitive chip 02. A side of the photosensitive chip 02 that faces away from the circuit board 01 has a photosensitive area and a non-photosensitive area surrounding the photosensitive area. A pad 021 is disposed on the non-photosensitive area. The pad 021 of the photosensitive chip 02 and the signal pin 011 of the circuit board 01 are connected by a metal wire 07 extending from the non-photosensitive area of the photosensitive chip 02 to the circuit board 01. The package cover 03 is disposed over the photosensitive chip 02, the metal wire 07, and the surface-mount device 012. A sidewall of the package cover is bonded to the circuit board 01. A light-transmitting aperture is disposed at a position on the package cover 03 and opposite to the photosensitive area of the photosensitive chip 02. The optical filter 04, the voice coil motor 05, and the camera 06 are sequentially disposed on a side of the package cover 03 away from the circuit board 01, and the optical filter 04 is disposed at a position opposite to the light-transmitting aperture of the package cover 03.

In the camera module with the foregoing structure, on the one hand, space needs to be reserved on the circuit board for bonding the sidewall of the package cover; on the other hand, during bonding, it is necessary to dispense glue at the bottom of the sidewall of the package cover. Some of the glue inevitably overflows when the package cover, after dispensing, is being bonded on the circuit board. To avoid the overflowed glue from affecting the surface-mount device on the circuit board, a safe distance also needs to be reserved between the sidewall of the package cover and the surface-mount device. This further increases a size of the circuit board, and is not conducive to the miniaturization design of the camera module.

SUMMARY

This application provides a photosensitive chip package structure, a camera module, and a mobile terminal, to reduce a size of the camera module and facilitate miniaturization development.

According to a first aspect, this application provides a photosensitive chip package structure, where the photosensitive chip package structure includes a substrate, a photosensitive chip, and a frame. The photosensitive chip is mounted on the substrate, and the frame is disposed on a side of the photosensitive chip facing away from the substrate. The photosensitive chip has a photosensitive area and a non-photosensitive area, where the non-photosensitive area is disposed around the photosensitive area. The photosensitive chip and the substrate are electrically connected by a metal wire. In specific disposing, a pad is disposed on the non-photosensitive area of the photosensitive chip, a signal pin is disposed on the substrate, and two ends of the metal wire are respectively connected to the pad and the signal pin. In other words, the metal wire extends from the non-photosensitive area of the photosensitive chip to the substrate. On a side of the frame facing the substrate, an avoidance groove is disposed on the frame to avoid the metal wire. The avoidance groove extends along a side edge of the frame. An inner wall of the avoidance groove is an arc-shaped inner wall. The avoidance groove is filled with filling glue inside. When the filling glue is disposed, on one hand, the filling glue can wrap around the metal wire, so that the metal wire is protected. On the other hand, the filling glue can be used to bond the frame to the substrate and the non-photosensitive area of the photosensitive chip, so that the frame is supported and is relatively fastened to the photosensitive chip and the substrate.

In the foregoing embodiment, on a side edge that the avoidance groove is disposed on the frame, the filling glue is filled in the avoidance groove to wrap around the metal wire and bond the frame to the photosensitive chip and the substrate. In this way, the photosensitive chip is sealed on the side, and a cured filling glue can further support the frame. In other words, the filling glue filled in the avoidance groove can achieve a function of a sidewall in the current technology, and there is no need to reserve space for mounting the sidewall on the side of the substrate. Therefore, this can significantly reduce a size of the substrate, so that a purpose of reducing the size of the camera module is achieved. In addition, the arc-shaped inner wall of the avoidance groove can prevent air bubbles from being generated when the filling glue is being filled in, so that the filling glue within the avoidance groove has a better filling effect, overflow of the filling glue is avoided during assembling, the supporting effect of the cured filling glue is improved, and structural stability of the photosensitive chip package structure is improved.

In a specific implementation, the frame has a light-transmitting aperture that is disposed at a position opposite to the photosensitive area of the photosensitive chip, so that light can pass through the light-transmitting aperture to irradiate the photosensitive area of the photosensitive chip. To filter out infrared light in the light, the photosensitive chip package structure further includes an optical filter, where the optical filter is disposed on the frame at a position opposite to the light-transmitting aperture.

When the optical filter is disposed, the frame can be designed into a different structure based on a specific location of the optical filter in the frame. For example, in a specific implementation, the optical filter is disposed on a side of the frame facing away from the photosensitive chip. In specific disposing, to reduce a height of the camera module, a countersink is disposed on the side of the frame facing away from the photosensitive chip, and the countersink can form an annular step structure with the light-transmitting aperture, so that the optical filter can be fastened to the annular step structure. This reduces a distance between the optical filter and the photosensitive chip, and therefore, a purpose of reducing the height of the camera module is achieved.

Specifically, when the countersink is disposed, a depth of the countersink is not less than a thickness of the optical filter. Therefore, when the optical filter is fastened to the annular step structure, the optical filter does not extend beyond a surface of the side of the frame facing away from the photosensitive chip. This further reduces the height of the camera module.

In another specific implementation, the optical filter is disposed on a side of the frame facing the photosensitive chip. This further reduces a thickness of the frame. In addition, when a voice coil motor is mounted on the side of the frame facing away from the photosensitive chip, the area on the frame that acts as a support is actually an area around the light-transmitting aperture. Therefore, a size of the voice coil motor needs to be larger than a size of the light-transmitting aperture, so that a smaller voice coil motor can be mounted on the frame. This further helps to reduce the size of the camera module.

In a specific implementation, the frame has a first retaining wall and a second retaining wall, where the first retaining wall and the second retaining wall are respectively disposed on two sides of the avoidance groove to limit the filling glue as much as possible within the avoidance groove. The first retaining wall is located on a side of the avoidance groove that is close to the photosensitive area. To better bond the frame to the substrate and the non-photosensitive area of the photosensitive chip, in specific disposing, a lower surface of the first retaining wall is spaced from the photosensitive chip, and a lower surface of the second retaining wall is spaced from the substrate.

When the optical filter is disposed on the side of the frame facing the photosensitive chip, in a specific implementation, a sidewall of the optical filter is used to form an inner sidewall of the first retaining wall. This simplifies a structure of the frame and reduces the thickness of the frame.

When the optical filter is disposed on the side of the frame facing away from the photosensitive chip, an angle formed between the inner sidewall of the first retaining wall and the lower surface of the first retaining wall is an obtuse angle. This helps the filling glue better wrap around the metal wire.

In specific disposing of the arc-shaped inner wall of the avoidance groove, an inner sidewall of the second retaining wall includes a first arc-shaped surface and a second arc-shaped surface, where the first arc-shaped surface is connected to the lower surface of the second retaining wall and the second arc-shaped surface is connected to a bottom wall of the avoidance groove. To smoothly connect the first arc-shaped surface and the second arc-shaped surface, the first arc-shaped surface protrudes toward the interior of the avoidance groove, and the second arc-shaped surface protrudes backward the interior of the avoidance groove.

In a specific implementation, a radius of the first arc-shaped surface is greater than a radius of the second arc-shaped surface. A plane of a side, of the substrate, on which the photosensitive chip is mounted is a preset first plane. In this embodiment, a width of a projection of the first arc-shaped surface in the first plane is greater than a width of a projection of the second arc-shaped surface in the first plane. This solution allows a shape of the arc-shaped inner wall of the avoidance groove to better match a shape of the metal wire, so that the filling glue can better wrap around the metal wire.

The inner sidewall of the second retaining wall includes a first end and a second end, where the first end is a connection end between the inner sidewall of the second retaining wall and the lower surface of the second retaining wall, and the second end is a connection end between the inner sidewall of the second retaining wall and the bottom wall of the avoidance groove. In a specific implementation, an angle formed by the lower surface of the second retaining wall and a line between the first end and the second end is an obtuse angle. Similarly, this solution also helps the filling glue better wrap around the metal wire.

In specific disposing of the avoidance groove, the avoidance groove can be disposed along one, two, or three edges of the frame. In this way, on a side of the frame where the avoidance groove is disposed, the photosensitive area of the photosensitive chip can be sealed by the filling glue. On a side of the frame where the avoidance groove is not disposed, the frame has a sidewall connected to the substrate. The photosensitive area of the photosensitive chip can be sealed by the sidewall. In other words, in this solution, the filling glue and the sidewall together seal the photosensitive area of the photosensitive chip.

In another specific implementation, the avoidance groove is disposed along four edges of the frame, and the avoidance groove is of a ring-shaped structure. In this way, the photosensitive area of the photosensitive chip can be packaged by the filling glue filled in the avoidance groove.

In a specific implementation, when a surface-mount device is disposed in an area of the substrate that avoids the photosensitive chip, a flange is further disposed on the frame. The flange can cover the surface-mount device to protect the surface-mount device.

To reduce a difficulty of assembling the photosensitive chip package structure and to improve a force condition of the filling glue, the frame further includes a support pin, where one end of the support pin is connected to the substrate, and the other end of the support pin is connected to the frame, so as to support the frame.

In a specific implementation, the frame is fabricated using an epoxy molding process, so that good flatness and structural strength can be obtained.

According to a second aspect, this application further provides a camera module, where the camera module includes the photosensitive chip package structure according to any of the foregoing implementations. The camera module has a relatively small size.

According to a third aspect, this application further provides a mobile terminal. The mobile terminal includes the foregoing camera module. Because a size of the camera module is reduced, it is easier to realize miniaturization and ultra-thin design of the mobile terminal.

DESCRIPTION OF EMBODIMENTS

To make the objectives, technical solutions, and advantages of the present invention clearer, the following further describes the present invention in detail with reference to the accompanying drawings. Apparently, the described embodiments are merely some rather than all of the embodiments of the present invention. All other embodiments obtained by a person of ordinary skill in the art based on the embodiments of the present invention without creative efforts shall fall within the protection scope of the present invention.

Figure 2:
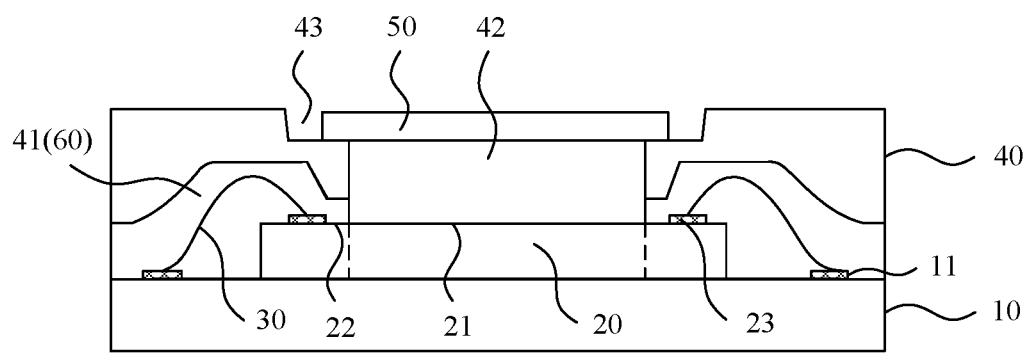
FIG. 2 is a schematic structural diagram of a photosensitive chip package structure according to an embodiment of this application.

First, referring to FIG. 2, a photosensitive chip package structure provided in an embodiment of this application includes a substrate 10 and a photosensitive chip 20, where the photosensitive chip 20 is mounted on the substrate 10. On a side of the photosensitive chip 20 facing away from the substrate 10, the photosensitive chip 20 has a photosensitive area 21 and a non-photosensitive area 22 surrounding the photosensitive area 21. When the photosensitive chip 20 is electrically connected to the substrate 10, in this embodiment of this application, a pad 23 is disposed on the non-photosensitive area 22 of the photosensitive chip 20. A signal pin 11 is disposed on an area of the substrate 10 that avoids the photosensitive chip 20. The pad 23 and the signal pin 11 are connected by a metal wire 30 extending from the non-photosensitive area 22 of the photosensitive chip 20 to the substrate 10. When the pad 23 or the signal pin 11 is disposed, the pad 23 or signal pin 11 may be disposed along one, two, three, or four edges of the photosensitive chip 20. Correspondingly, the metal wire 30 may also be disposed along one, two, three, or four edges of the photosensitive chip 20.

Figure 9:
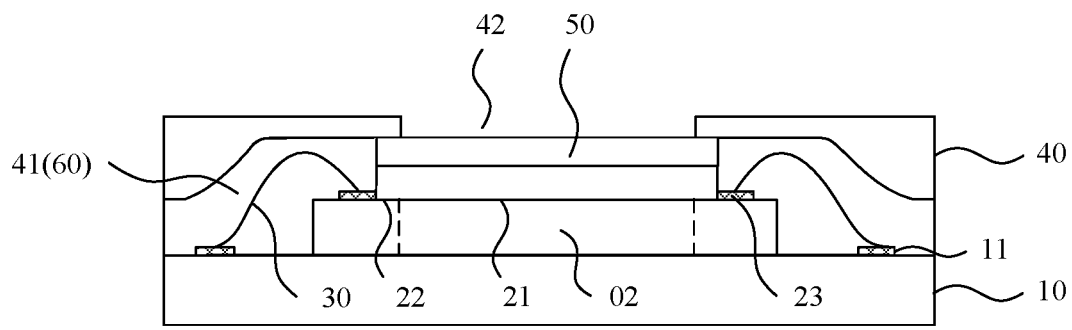
FIG. 9 is a schematic structural diagram of another photosensitive chip package structure according to an embodiment of this application.

Still referring to FIG. 2, the photosensitive chip package structure of this embodiment of this application also includes a frame 40 disposed on a side of the photosensitive chip 20 facing away from the substrate 10. The frame 40 is fabricated using an epoxy molding process, so that good flatness and structural strength can be obtained. On a side of the frame 40 facing the substrate 10, an avoidance groove 41 is disposed on the frame 40 to avoid the metal wire 30. The avoidance groove 41 extends along a side edge of the frame 40. An inner wall of the avoidance groove 41 is an arc-shaped inner wall. When the frame is fastened, the avoidance groove is filled with filling glue 60. As shown in FIG. 2 or FIG. 9, on one hand, the filling glue 60 can wrap around the metal wire 30. On the other hand, the filling glue 60 can bond the frame 40 to the substrate 10 and the non-photosensitive area 22 of the photosensitive chip 20. In this way, the side edge, of the photosensitive chip 20, on which the metal wire 30 is disposed can be sealed by the filling glue 60, and a cured filling glue 60 can further support the frame 40. In addition, in specific disposing of the avoidance groove 41, as shown in FIG. 2 and FIG. 7 or FIG. 9 and FIG. 12, a manner in which the avoidance groove 41 is arranged on the frame 40 is related to a disposing position of the metal wire 30. When the metal wire 30 is disposed along one, two, or three edges of the photosensitive chip 20, it is only necessary to dispose the avoidance groove 41 on a corresponding side edge of the frame 40 to avoid the metal wire 30. In this way, on the side edge, of the frame 40, on which the avoidance groove 41 is disposed, the filling glue 60 supports the frame 40 and seals the photosensitive chip 20. On a side edge, of the frame 40, on which the avoidance groove 41 is not disposed, a sidewall 44 may be disposed on the frame 40 and connected to the substrate 10. The sidewall 44 supports the frame 40 on the side and seals the photosensitive chip 20. In specific implementation, glue may be dispensed at the bottom of the sidewall 44 to bond the sidewall 44 to the substrate 10. It should be understood that regardless of which side of the frame 40 the avoidance groove 41 is disposed on, it needs to be ensured that after the frame 40 is fastened, the sidewall 44 and the filling glue 60 within the avoidance groove 41 can encircle enclosed space that can package the photosensitive area 21 of the photosensitive chip 20. When the metal wire 30 is disposed along four edges of the photosensitive chip 20, the avoidance groove 41 for avoiding the metal wire 30 also needs to be disposed along the four edges of the frame 40, and the avoidance groove 41 is of a ring-shaped structure in this case. In this way, the photosensitive area 21 of the photosensitive chip 20 can be packaged by the filling glue 60 filled in the ring-shaped avoidance groove 41.

Figure 4:
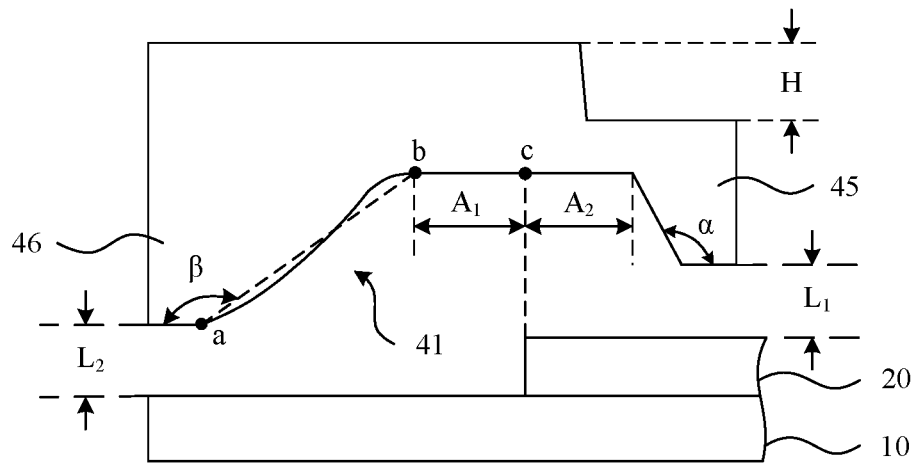
FIG. 4 is another partial schematic structural diagram of a photosensitive chip package structure according to an embodiment of this application.
Figure 5:
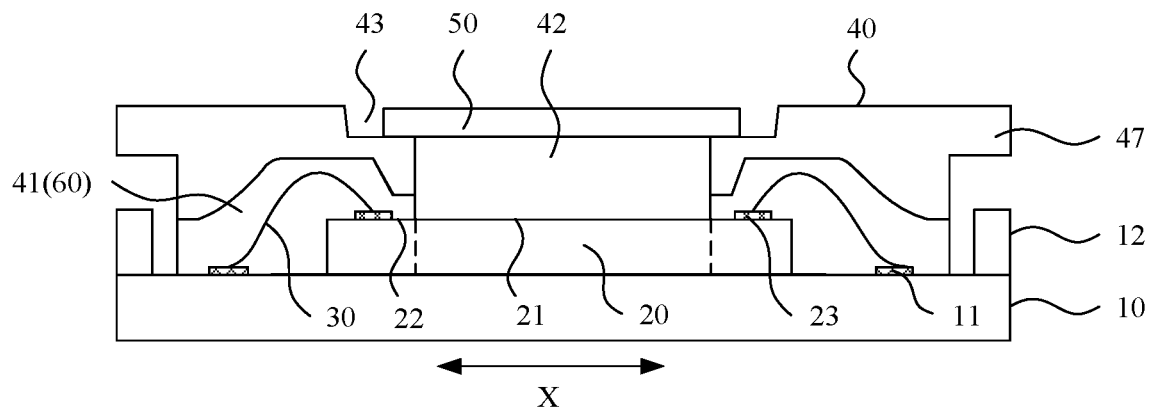
FIG. 5 is a schematic structural diagram of another photosensitive chip package structure in an X direction according to an embodiment of this application.
Figure 6:
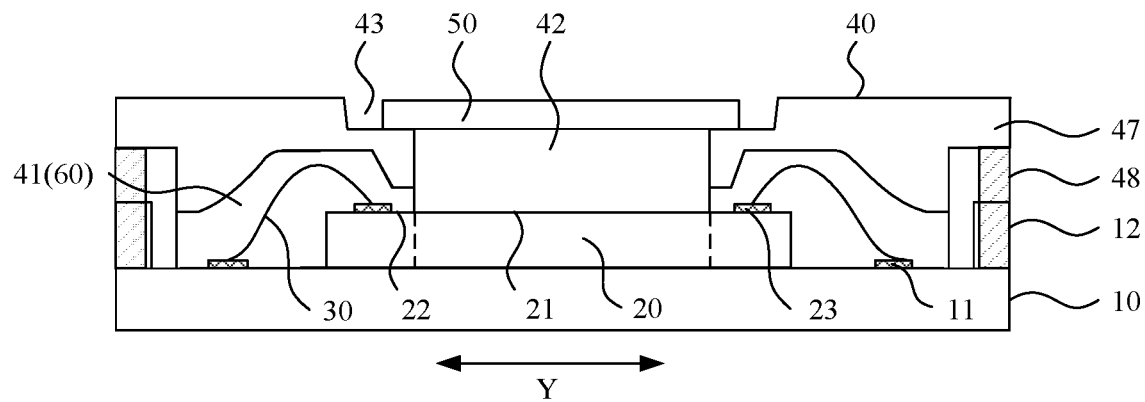
FIG. 6 is a schematic structural diagram of another photosensitive chip package structure in a Y direction according to an embodiment of this application.
Figure 7:
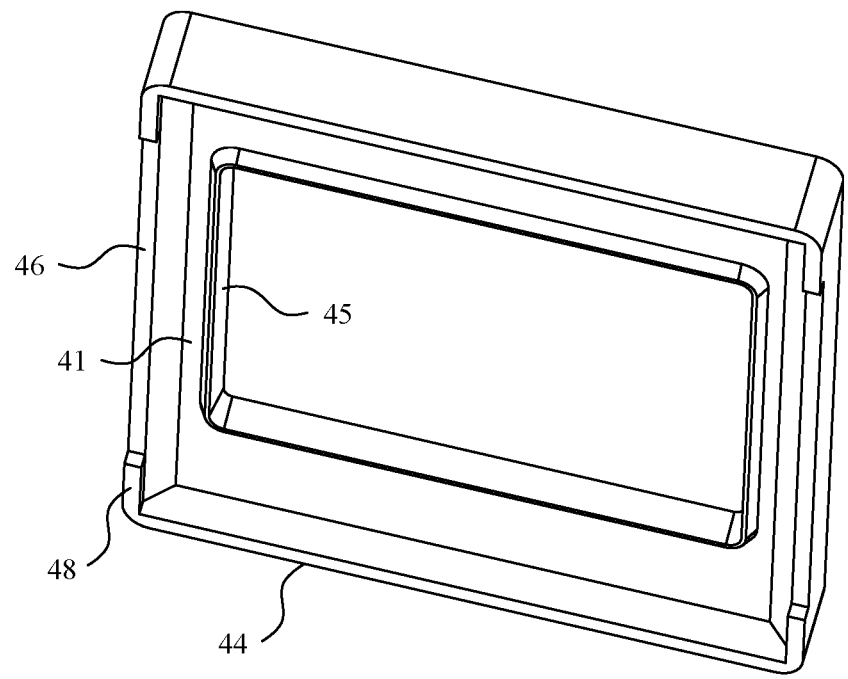
FIG. 7 is a schematic structural diagram of a frame according to an embodiment of this application.

Referring to FIG. 4 to FIG. 6, the frame 40 has a first retaining wall 45 and a second retaining wall 46, where the first retaining wall 45 and the second retaining wall 46 are separately disposed on two sides of the avoidance groove 41 to limit the filling glue 60 as much as possible within the avoidance groove 41. In this way, overflow of the filling glue 60 is avoided during assembling, so that the photosensitive area 21 of the photosensitive chip 20 or an electronic element on the substrate 10 is avoided from being contaminated. The first retaining wall 45 is located on a side of the avoidance groove 41 that is close to the photosensitive area 21, and the second retaining wall 46 is located on a side of the avoidance groove 41 that is away from the photosensitive area 21. In addition, in specific disposing, a lower surface of the first retaining wall 45 is spaced from the photosensitive chip 20, and a lower surface of the second retaining wall 46 is spaced from the substrate 10. In this way, a gap $L_1$ between the photosensitive chip 20 and the lower surface of the first retaining wall 45, and a gap $L_2$ between the substrate 10 and the lower surface of the second retaining wall 46 actually provide buffer space for the overflow of the filling glue 60. On the basis of not causing contamination to the photosensitive area 21 of the photosensitive chip 20 or the electronic element on the substrate 10, a filling effect of the filling glue 60 within the avoidance groove 41 is ensured, a bonding area between the filling glue 60 and both of the photosensitive chip 20 and the substrate 10 is increased, and structural stability of the photosensitive chip package structure is further improved. Specific values of the gap $L_1$ between the photosensitive chip 20 and the lower surface of the first retaining wall 45, and the gap $L_2$ between the substrate 10 and the lower surface of the second retaining wall 46 may be set based on experience. For example, in this embodiment of this application, the gap $L_1$ between the photosensitive chip 20 and the lower surface of the first retaining wall 45, and the gap $L_2$ between the substrate 10 and the lower surface of the second retaining wall 46 can be set to be not less than 0.15 mm, and the specific values can be set to 0.16 mm, 0.18 mm, or 0.2 mm. Specific values of a width $L_3$ of the lower surface of the first retaining wall 45 and a width $L_4$ of the lower surface of the second retaining wall 46 can also be customized. For example, in this embodiment of this application, the width $L_3$ of the lower surface of the first retaining wall 45 is not less than 0.1 mm, and the specific value can be set to 0.12 mm, 0.14 mm, or 0.15 mm. The width $L_4$ of the lower surface of the second retaining wall 46 is not less than 0.2 mm, and the specific value can be set to 0.22 mm, 0.24 mm, or 0.25 mm.

As shown in FIG. 4, an angle α formed between an inner sidewall of the first retaining wall and the lower surface of the first retaining wall is an obtuse angle. This solution allows a shape of the avoidance groove 41 to better match a shape of the metal wire, so that the filling glue 60 can better wrap around the metal wire. A specific angle value of α can be determined based on experience. For example, in this embodiment of this application, α can range from 100° to 120°, and the specific value can be set to 110°, 115°, or 120°.

Figure 3:
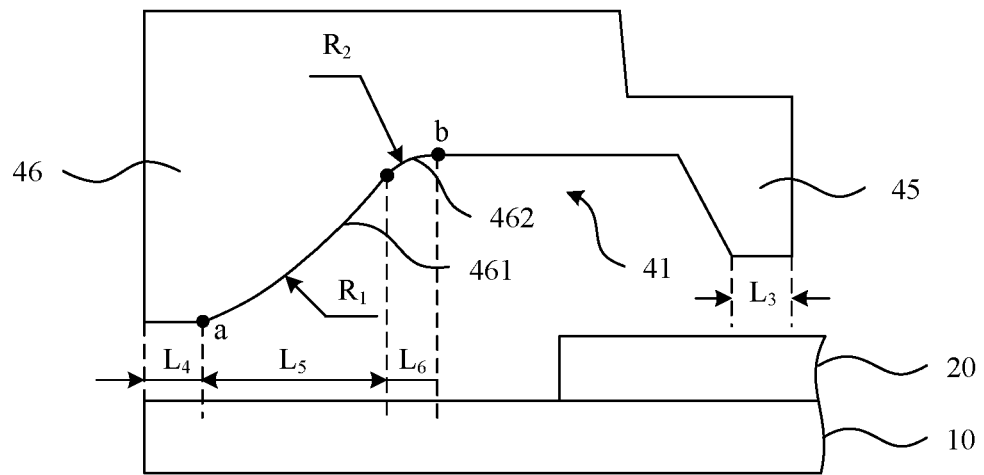
FIG. 3 is a partial schematic structural diagram of a photosensitive chip package structure according to an embodiment of this application.

In specific disposing of the arc-shaped inner wall of the avoidance groove 41, as shown in FIG. 3, an inner sidewall of the second retaining wall 46 includes a first arc-shaped surface 461 and a second arc-shaped surface 462, where the first arc-shaped surface 461 is connected to the lower surface of the second retaining wall 46 and the second arc-shaped surface 462 is connected to a bottom wall of the avoidance groove 41. To smoothly connect the first arc-shaped surface 461 and the second arc-shaped surface 462, the first arc-shaped surface 461 protrudes toward the interior of the avoidance groove 41, and the second arc-shaped surface 462 protrudes backward the interior of the avoidance groove 41, so that the filling glue within the avoidance groove 41 has a better filling effect. In a specific embodiment, a radius $R_1$ of the first arc-shaped surface 461 is greater than a radius $R_2$ of the second arc-shaped surface 462. A plane of a side, of the substrate 10, on which the photosensitive chip 20 is mounted is a preset first plane. In this embodiment, a width $L_5$ of a projection of the first arc-shaped surface 461 in the first plane is greater than a width $L_6$ of a projection of the second arc-shaped surface 462 in the first plane. This solution allows the shape of the avoidance groove 41 to better match the shape of the metal wire, so that the filling glue can better wrap around the metal wire.

Specific values of the radius $R_1$ of the first arc-shaped surface 461 and the radius $R_2$ of the second arc-shaped surface 462 can be customized. In this embodiment of this application, the radius $R_1$ of the first arc-shaped surface 461 can range from 0.4 mm to 0.6 mm, and the specific value can be set to 0.45 mm, 0.5 mm, or 0.55 mm. The radius $R_2$ of the second arc-shaped surface 462 can range from 0.2 mm to 0.3 mm, and the specific value can be set to 0.25 mm or 0.3 mm. The width of the projection of the first arc-shaped surface 461 in the first plane and the width of the projection of the second arc-shaped surface 462 in the first plane refer to a width of the first arc-shaped surface 461 and a width of the second arc-shaped surface 462 in an X direction or a Y direction. In addition, in this embodiment of this application, the width $L_5$ of the projection of the first arc-shaped surface 461 in the first plane can range from 0.15 mm to 0.25 mm, and the specific value can be set to 0.18 mm, 0.2 mm, or 0.22 mm.

As shown in FIG. 4, the inner sidewall of the second retaining wall 46 includes a first end a and a second end b, where the first end a is a connection end between the inner sidewall of the second retaining wall 46 and the lower surface of the second retaining wall 46, and the second end b is a connection end between the inner sidewall of the second retaining wall 46 and the bottom wall of the avoidance groove 41. In a specific implementation, an angle β formed by the lower surface of the second retaining wall 46 and a line between the first end a and the second end b is an obtuse angle. Similarly, this solution also allows the shape of the avoidance groove 41 to match the shape of the metal wire better. A specific angle value of β can also be determined based on experience. In this embodiment of this application, β can range from 120° to 150°, and the specific value can be set to 125°, 135°, or 145°.

In addition, the second end b of the inner sidewall of the second retaining wall 46 also constitutes one of ends of the bottom wall of the avoidance groove 41. A projection of the end in the first plane has a distance $A_1$ from an edge of the photosensitive chip 20. A projection of the other end c of the bottom wall of the avoidance groove 41 in the first plane has a distance $A_2$ from the edge of the photosensitive chip 20. In this embodiment of this application, $A_1$ and $A_2$ are both equal to a distance from the pad 23 disposed on the photosensitive chip 20 to the edge of the photosensitive chip 20.

Referring to FIG. 2, the frame 40 further has a light-transmitting aperture 42 that is disposed at a position opposite to the photosensitive area 21 of the photosensitive chip 20, so that light can pass through the light-transmitting aperture 42 to irradiate the photosensitive area 21 of the photosensitive chip 20. In addition, to filter out infrared light in the light, an optical filter 50 is further disposed on the frame 40 at a position opposite to the light-transmitting aperture 42. The optical filter 50 may be fastened to the frame 40 by bonding.

In this embodiment of this application, the optical filter 50 may be disposed on a side of the frame 40 facing away from the photosensitive chip 20. Alternatively, the optical filter 50 may be disposed on a side of the frame 40 facing the photosensitive chip 20. In specific implementation, the frame 40 may have a different structure based on a position of the optical filter 50. For example, when the optical filter 50 is disposed on the side of the frame 40 facing away from the photosensitive chip 20, as shown in FIG. 2, a countersink 43 is disposed on the side of the frame 40 facing away from the photosensitive chip 20 in this embodiment. The countersink 43 forms an annular step structure with the light-transmitting aperture 42, and the optical filter 50 is fastened to the annular step structure. Instead of disposing the optical filter 50 directly on the side of the frame 40 facing away from the photosensitive chip 20, this solution embeds the optical filter 50 in a structure of the frame 40, which reduces a distance between the optical filter 50 and the photosensitive chip 20. Therefore, a height of the photosensitive chip package structure is reduced, and a purpose of reducing a height of a camera module is further achieved. When the countersink 43 is disposed, referring to FIG. 2 and FIG. 6, a depth H of the countersink 43 is not less than a thickness of the optical filter 50. Therefore, when the optical filter 50 is fastened to the annular step structure, the optical filter 50 does not extend beyond a surface of the side of the frame 40 facing away from the photosensitive chip 20. This further reduces the height of the camera module.

Figure 14:
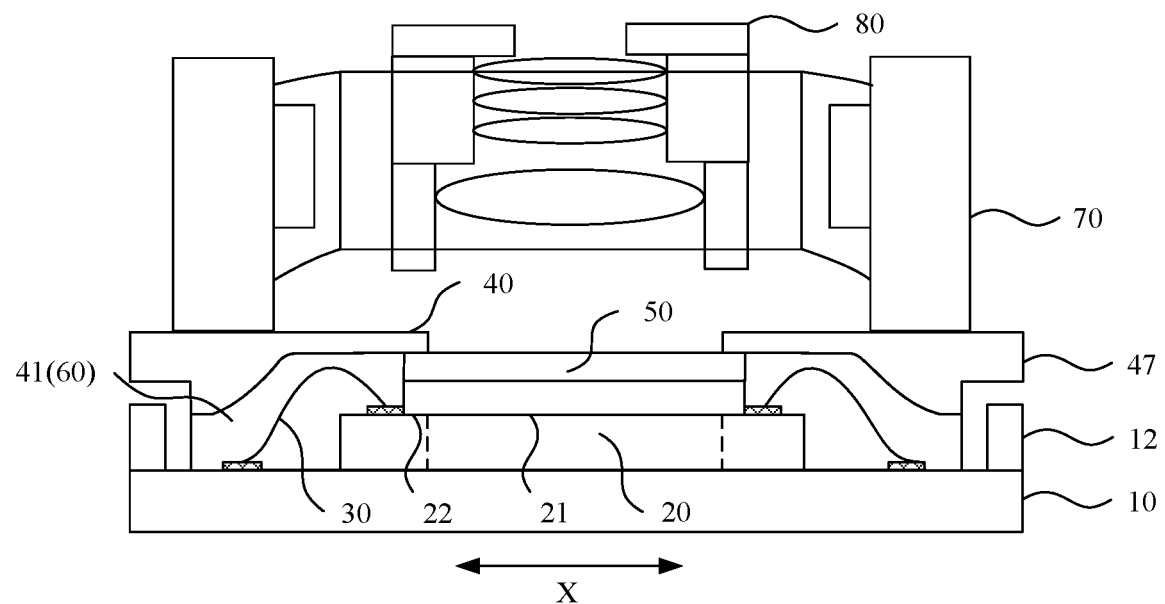
FIG. 14 is a schematic structural diagram of another camera module according to an embodiment of this application.

Referring to FIG. 9, when the optical filter 50 is disposed on the side of the frame 40 facing the photosensitive chip 20, the height of the frame 40 can be further reduced. In addition, referring to FIG. 11 and FIG. 14, when a voice coil motor 70 is mounted on the side of the frame 40 facing away from the photosensitive chip 20, the area on the frame 40 that acts as a support is actually an area around the light-transmitting aperture 42. Therefore, a size of the voice coil motor in an X direction or a Y direction needs to be larger than a diameter of the light-transmitting aperture 42, so that a smaller voice coil motor can be mounted on the frame 40. This helps to further reduce the size of the camera module in the X direction and the Y direction, and further realize miniaturization and ultra-thin design of a mobile terminal. It should be noted that, the width of the lower surface of the first retaining wall 45 and the width of the lower surface of the second retaining wall 46 also refer to the width of the lower surface of the first retaining wall 45 and the width of the lower surface of the second retaining wall 46 in the X or Y direction.

Figure 10:
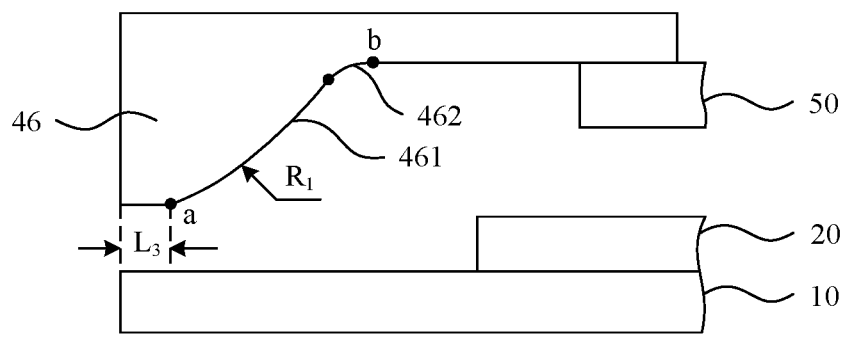
FIG. 10 is still another partial schematic structural diagram of a photosensitive chip package structure according to an embodiment of this application.

In addition, in this embodiment of this application, when the optical filter 50 is disposed on the side of the frame 40 facing the photosensitive chip 20, referring to FIG. 9 and FIG. 10, a sidewall of the optical filter 50 can be used to form an inner sidewall of the first retaining wall 45. Therefore, a structure of the first retaining wall does not need to be additionally disposed on the frame 40 in this solution. In this way, on the basis of reducing the thickness of the frame 40, this can further simplify the structure of the frame 40 and reduce a difficulty of a fabrication process of the frame 40.

Figure 1:
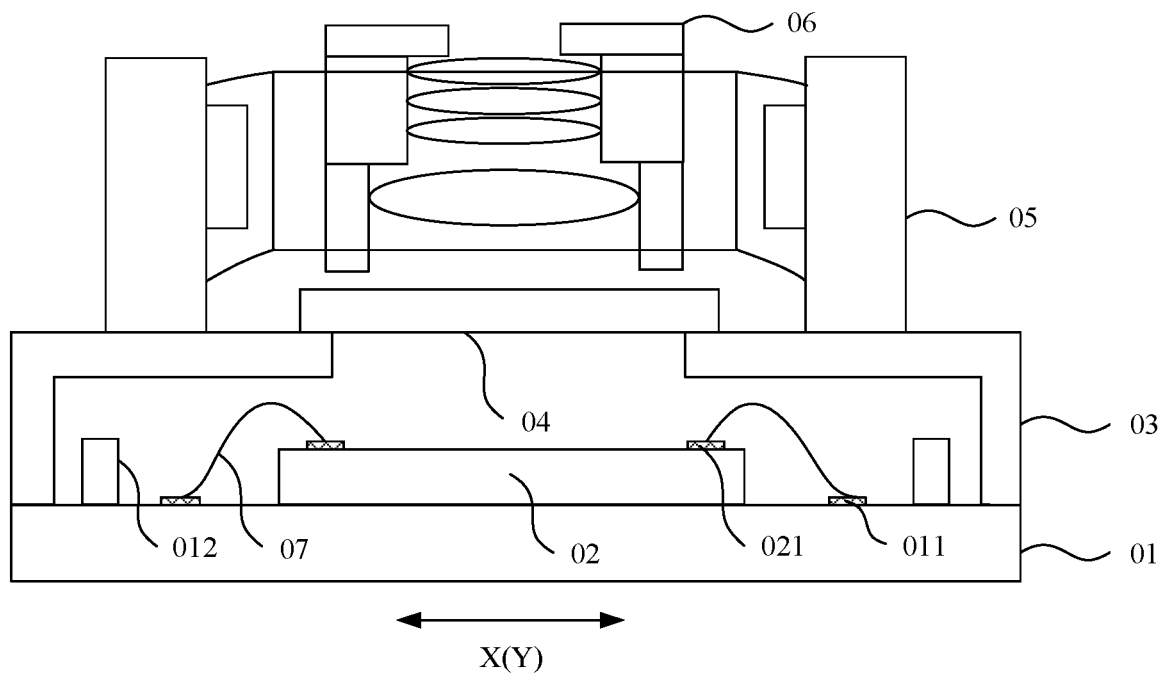
FIG. 1 is a schematic structural diagram of a camera module in the current technology.

In the foregoing embodiment, on a side edge that the avoidance groove 41 is disposed on the frame 40, the filling glue is filled in the avoidance groove 41 to wrap around the metal wire 30 and bond the frame 40 to the photosensitive chip 20 and the substrate 10. In this way, the photosensitive chip 20 is sealed on the side, and the cured filling glue 60 can further support the frame 40. By comparing FIG. 1 with FIG. 5, it can be learned that the filling glue 60 filled in the avoidance groove 41 can achieve a function of a sidewall in the current technology, and there is no need to reserve space for mounting the sidewall on the side of the substrate 10. Therefore, this can significantly reduce a size of the substrate in the X direction or the Y direction, so that a purpose of reducing the size of the camera module is achieved. In addition, the arc-shaped inner wall of the avoidance groove 41 can prevent air bubbles from being generated when the filling glue 60 is filled in, so that the filling glue 60 within the avoidance groove 41 has a better filling effect, the overflow of the filling glue 60 is avoided during assembling, the supporting effect of the cured filling glue 60 is improved, and the structural stability of the photosensitive chip package structure is improved.

Figure 11:
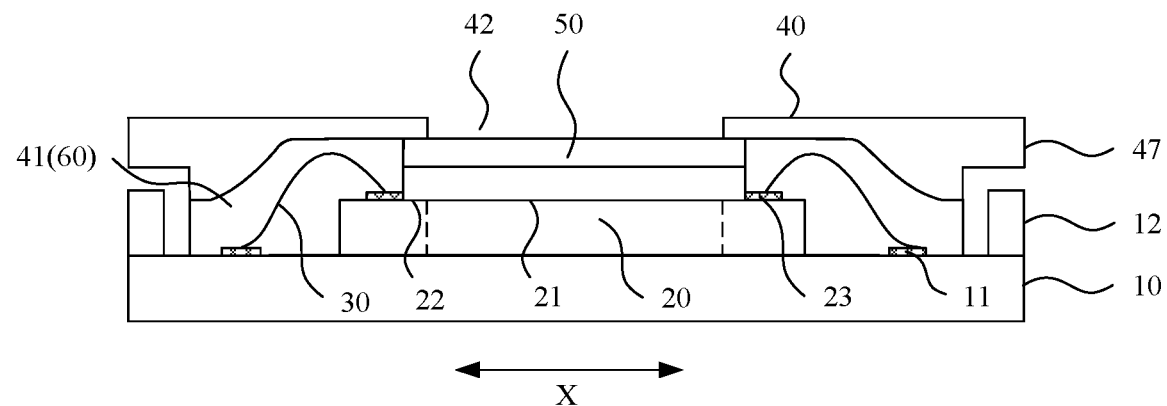
FIG. 11 is a schematic structural diagram of still another photosensitive chip package structure in an X direction according to an embodiment of this application.

As shown in FIG. 5 and FIG. 11, when a surface-mount device 12 is disposed in an area of the substrate 10 that avoids the photosensitive chip 20, a flange 47 is further disposed on the frame 40. The flange 47 can cover the surface-mount device 12, and the flange 47 is an extended structure on the frame 40 and does not need to be supported separately. Therefore, this solution protects the surface-mount device 12 without increasing a size of the substrate 10.

Figure 8:
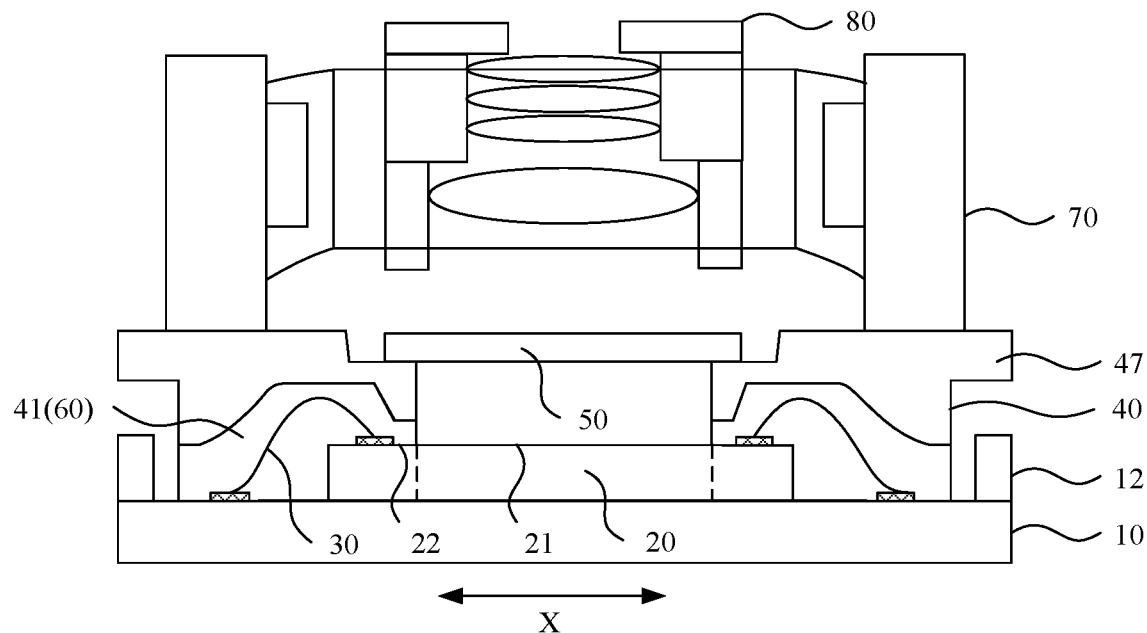
FIG. 8 is a schematic structural diagram of a camera module according to an embodiment of this application.
Figure 12:
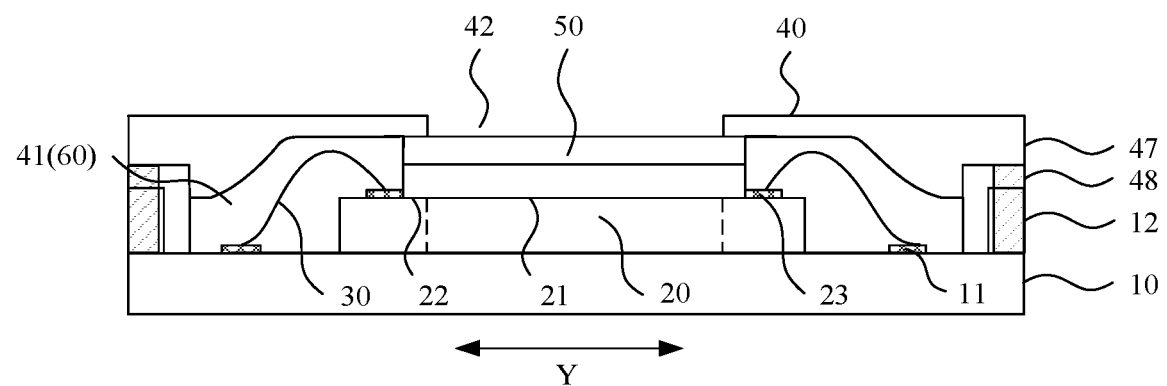
FIG. 12 is a schematic structural diagram of still another photosensitive chip package structure in a Y direction according to an embodiment of this application.

Referring to FIG. 8, when the photosensitive chip package structure is assembled, first the optical filter 50 is fastened to the frame 40. An orientation of the frame 40 is adjusted so that a side that the avoidance groove 41 is disposed faces upward. Glue is dispensed in the avoidance groove 41. After dispensing, the frame 40 is turned over and is placed in a loading tray of an automatic chip bonder. Then, after positioning performed by the automatic chip bonder, the frame 40 is mounted on the substrate 10 where wiring has been completed. In this way, the avoidance groove 41 covers an area where the metal wire 30 is disposed. The filling glue 60 in the avoidance groove 41 wraps around the metal wire 30 and bonds the frame 40 to the substrate 10 and the non-photosensitive area 22 of the photosensitive chip 20. To reduce a difficulty of assembling the photosensitive chip package structure and to improve a force condition of the filling glue 60, as shown in FIG. 6, in this embodiment of this application, the frame 40 further includes a support pin 48, where two ends of the support pin 48 are connected to the substrate 10 and the frame 40 respectively, so as to support the frame 40. When the frame 40 is mounted on the substrate 10, the support pin 48 can control a mounting height of the frame 40, that is, to position the frame 40 in terms of the assembling height. This reduces the difficulty of mounting. In addition, the support pin 48 can also support the frame 40, to prevent an overall weight of the frame 40 and other components disposed on the frame 40 from being used in the filling glue 60. In this way, a reliability problem caused by glue aging is avoided. In specific implementation, the support pin 48 may be disposed on the flange 47 of the frame 40. In addition, when support pins 48 are evenly disposed on the flange 47, the difficulty of mounting may be further reduced. It can be understood that the embodiment shown in FIG. 6 is an example where the optical filter 50 is disposed on the side of the frame 40 facing away from the photosensitive chip 20. Referring to FIG. 12, when the optical filter 50 is disposed on the side of the frame 40 facing the photosensitive chip 20, the support pin 48 can also be disposed on the flange 47 to support the frame 40 and reduce the difficulty of mounting. Details are not described herein.

Figure 13:
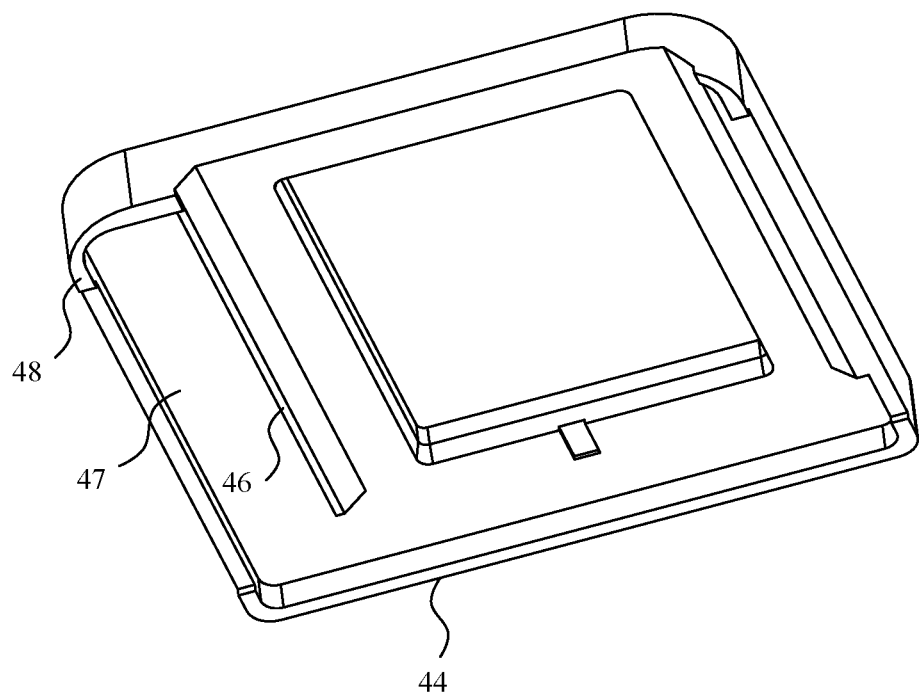
FIG. 13 is a schematic structural diagram of another frame according to an embodiment of this application.

An embodiment of this application further provides a camera module including the photosensitive chip package structure according to any one of the foregoing embodiments. In addition, as shown in FIG. 8 or FIG. 13, the camera module further includes a voice coil motor 70 and a camera 80, where the voice coil motor 70 and the camera 80 are disposed sequentially on a side of the frame 40 away from the substrate 10. A size of the camera module can be significantly reduced by using the foregoing photosensitive chip package structure.

An embodiment of this application further provides a mobile terminal, including the foregoing camera module. The mobile terminal may be a common mobile terminal such as a mobile phone, a surface computer, or a laptop. When a size of the camera module is reduced, it is easier to realize miniaturization and ultra-thin design of the mobile terminal.

The foregoing descriptions are merely specific embodiments of the present invention, but are not intended to limit the protection scope of the present embodiments. Any variation or replacement readily figured out by a person skilled in the art within the technical scope disclosed in the present embodiments shall fall within the protection scope of the present embodiments. Therefore, the protection scope of the present embodiments shall be subject to the protection scope of the claims.

What is claimed is:

1. A photosensitive chip package structure, comprising a substrate and a photosensitive chip mounted on the substrate, wherein a side of the photosensitive chip away from the substrate has a photosensitive area and a non-photosensitive area surrounding the photosensitive area, and the photosensitive chip is electrically connected to the substrate using a metal wire; and further comprising:
   a frame, disposed on the side of the photosensitive chip away from the substrate, wherein an avoidance groove used to avoid the metal wire is disposed on a side of the frame facing the substrate, wherein the avoidance groove extends along a side edge of the frame, and an inner wall of the avoidance groove is an arc-shaped inner wall; and
   a filling glue, filled in the avoidance groove, wrapping around the metal wire and bonding the frame to the non-photosensitive area of the photosensitive chip and the substrate.

2. The photosensitive chip package structure according to claim 1, wherein the photosensitive area corresponding to the photosensitive chip on the frame has a light-transmitting aperture; and
   the photosensitive chip package structure further comprises an optical filter, wherein the optical filter is disposed at a position opposite to the light-transmitting aperture of the frame.

3. The photosensitive chip package structure according to claim 2, wherein the optical filter is fastened to a side of the frame facing the photosensitive chip.

4. The photosensitive chip package structure according to claim 2, wherein a side of the frame away from the photosensitive chip has a countersink, and the countersink and the light-transmitting aperture form an annular step structure, and the optical filter is fastened to the annular step structure.

5. The photosensitive chip package structure according to claim 4,
   wherein a depth of the countersink is not less than a thickness of the optical filter.

6. The photosensitive chip package structure according to claim 1, wherein the frame has a first retaining wall and a second retaining wall that are respectively disposed on two sides of the avoidance groove, and the first retaining wall is located on a side of the avoidance groove closest to the photosensitive area; and a lower surface of the first retaining wall is spaced from the photosensitive chip, and a lower end face of the second retaining wall is spaced from the substrate.

7. The photosensitive chip package structure according to claim 6, wherein the photosensitive chip package structure further comprises an optical filter fastened to a side of the frame facing the photosensitive chip, and a sidewall of the optical filter forms an inner sidewall of the first retaining wall.

8. The photosensitive chip package structure according to claim 6, wherein an angle formed between the inner sidewall of the first retaining wall and the lower surface of the first retaining wall is an obtuse angle.

9. The photosensitive chip package structure according to claim 6, wherein an inner sidewall of the second retaining wall comprises a first arc-shaped surface and a second arc-shaped surface that are connected to each other, the first arc-shaped surface is connected to a lower surface of the second retaining wall, the first arc-shaped surface protrudes towards the inside of the avoidance groove, and the second arc-shaped surface protrudes away from the inside of the avoidance groove.

10. The photosensitive chip package structure according to claim 9, wherein a radius of the first arc-shaped surface is greater than a radius of the second arc-shaped surface, and a width of a projection of the first arc-shaped surface on a first plane is greater than a width of a projection of the second arc-shaped surface on the first plane, wherein the first plane is a plane in which a side on which the photosensitive chip is mounted on the substrate is located.

11. The photosensitive chip package structure according to claim 9, wherein an angle formed between a connection line between a first end of the inner sidewall of the second retaining wall and a second end of the inner side wall of the second retaining wall and the lower surface of the second retaining wall is an obtuse angle, wherein the first end of the inner sidewall of the second retaining wall is a connection end between the inner sidewall of the second retaining wall and the lower surface of the second retaining wall, and the second end of the inner sidewall of the second retaining wall is a connection end between the inner sidewall of the second retaining wall and a bottom wall of the avoidance groove.

12. The photosensitive chip package structure according to claim 1, wherein the avoidance groove is disposed along one, two, or three edges of the frame, wherein the frame has a sidewall connected to the substrate on a side of the frame where no avoidance groove is disposed, and the filling glue and the sidewall together seal the photosensitive area of the photosensitive chip.

13. The photosensitive chip package structure according to claim 1, wherein the avoidance groove is disposed along four edges of the frame, and the filling glue seals the photosensitive area of the photosensitive chip.

14. The photosensitive chip package structure according to claim 1, wherein a surface-mount device is disposed in an area of the substrate that avoids the photosensitive chip, and a flange covering the surface-mount device is disposed on the frame.

15. The photosensitive chip package structure according to claim 14, wherein the frame further comprises a support pin, wherein one end of the support pin is connected to the substrate, and the other end of the support pin is connected to the frame.

16. A camera module, comprising the photosensitive chip package structure according to claim 1.

17. A mobile terminal, comprising the camera module according to claim claim 16.

* * * * *

UNITED STATES PATENT AND TRADEMARK OFFICE
CERTIFICATE OF CORRECTION

PATENT NO. : 11,869,908 B2  
APPLICATION NO. : 17/266057  
DATED : January 9, 2024  
INVENTOR(S) : Yajima et al.

Page 1 of 1

It is certified that error appears in the above-identified patent and that said Letters Patent is hereby corrected as shown below:

On the Title Page

Applicant (71): "Honor Device Co., Ltd., Guangdong (CN)" should read -- Honor Device Co., Ltd., Shenzhen (CN) --.

In the Claims

Claim 17, Column 12, Line 56: "according to claim claim 16." should read -- according to claim 16. --.

Signed and Sealed this  
Thirteenth Day of February, 2024

Katherine Kelly Vidal  
*Director of the United States Patent and Trademark Office*